United States Patent
Seddon

(10) Patent No.: US 7,450,059 B1
(45) Date of Patent: Nov. 11, 2008

(54) NON-LINEAR DISPERSIVE TRANSMISSION LINE ASSEMBLY

(75) Inventor: Nigel Seddon, Bristol (GB)

(73) Assignee: BAE Systems plc, Farnborough, Hampshire (GB)

( * ) Notice: Subject to any disclaimer, the term of this patent is extended or adjusted under 35 U.S.C. 154(b) by 1826 days.

(21) Appl. No.: 09/184,400

(22) Filed: Nov. 3, 1998

(30) Foreign Application Priority Data

Nov. 7, 1997 (GB) ................................. 9723454.6

(51) Int. Cl.
*G01S 7/282* (2006.01)

(52) U.S. Cl. .......................... 342/202; 342/13; 342/14; 342/175

(58) Field of Classification Search .................. 342/13, 342/14, 175, 200–204
See application file for complete search history.

(56) References Cited

U.S. PATENT DOCUMENTS

| | | | | |
|---|---|---|---|---|
| 3,028,597 A | * | 4/1962 | Kliger et al. ................. | 342/372 |
| 3,798,461 A | | 3/1974 | Edson | |
| 5,157,272 A | * | 10/1992 | Seddon ......................... | 307/106 |
| 5,923,227 A | * | 7/1999 | Seddon ......................... | 333/23 |
| 6,114,986 A | * | 9/2000 | Cassen et al. ................ | 342/175 |
| 7,170,444 B1 | * | 1/2007 | Seddon et al. ............... | 342/202 |
| 7,342,534 B1 | * | 3/2008 | Seddon et al. ............... | 342/375 |

FOREIGN PATENT DOCUMENTS

| | | | |
|---|---|---|---|
| GB | 1 580 063 | | 11/1980 |
| GB | 2 267 790 | | 12/1993 |
| GB | 2317752 A | * | 4/1998 |
| WO | WO 96/25778 | | 8/1996 |

\* cited by examiner

*Primary Examiner*—John B Sotomayor
(74) *Attorney, Agent, or Firm*—Nixon & Vanderhye P.C.

(57) ABSTRACT

A non-linear dispersive transmission line assembly for producing high power radio frequency electrical signals includes a transmission line (6, 7) having a plurality of series connected inductors (8) each incorporating saturable magnetic material to provide non-linearity, a first array (11) of capacitors interconnecting outermost ends of immediately adjacent pairs of the inductors (8) and a secondary array (14) of capacitors interconnecting outermost ends of immediately adjacent pairs of the inductors, with the second array interconnection points being spaced by one inductor from the first array interconnection points. The assembly also includes means for applying a first magnetic field to the transmission line (6,7) in a direction substantially perspectively to the direction of a second magnetic field produced in the transmission line by the application thereto of a high voltage input pulse which propagates through the transmission line to form an output high power radio frequency electrical signal.

11 Claims, 8 Drawing Sheets

NON-LINEAR DISPERSIVE TRANSMISSION LINE ASSEMBLY

FIELD OF THE INVENTION

This invention relates to a non-linear dispersive transmission line assembly particularly suitable for producing high power radio frequency electrical signals.

BACKGROUND OF THE INVENTION

High power radio frequency and microwave generators are necessary for the production of high power radio frequency signals. With such generators it is necessary to produce peak powers of up to at least 100MW and in this specification the term radio frequency is used to describe radiation in the high frequency, very high frequency, ultra high frequency and microwave regions of the electromagnetic spectrum. It is known that non-linear dispersive transmission lines such as that shown in FIG. 1 of the accompanying drawings, may be used to create radio frequency output pulses by modulation of an electrical impulse input which is injected into the line. Such a line can produce high peak power radio frequency signals with a peak power of more than 100MW. The line of FIG. 1 is an inductance/capacitance ladder transmission line to which non-linearity and dispersive characteristics have been added. The Figure shows five complete sections of the transmission line which could comprise as many as 100 or 200 such sections. An input pulse injected at the left hand side of the line at point 1 will propagate to the right hand side of the line to exit as an output radio frequency signal at 2. Capacitors 3 each having a value $C_0$ and inductors 4 each having a value $L_0$ form the primary elements of the transmission line. Saturable magnetic material is placed in each inductor 4 which causes the inductors to be non-linear. The capacitors 5 with a value $C^1$ form coupling capacitors used capacitively to link every second cell in the line thus giving the line additional dispersive characteristics. As a result of adding non-linearity and dispersion to the transmission line an electrical pulse which propagates along the line from point 1 to point 2 is distorted according to the specific characteristics of the transmission line. Such conventional non-linear transmission lines are used as pulse modulation circuits in which for example a suitable line could modify a flat top electrical input pulse to form any suitable shape radio frequency output signal. As the injected impulse propagates along the line, energy is transferred from the injected pulse into a radio frequency signal which also propagates from 1 to 2 in the line of FIG. 2. The radio frequency signal and the remains of the injected pulse are extracted at 2.

Propagation of the injected pulse through the line of FIG. 1 provides a source of electrical energy which moves along the transmission line. The effect of including non-linearity to the line is to modify the shape of the input pulse as it propagates along the line. The propagation velocity of a particular point in the input pulse is dependent on the amplitude of the signal of that point so various parts of the signal propagate with different velocities. Under these circumstances the front of the input pulse can sharpen into a shock front with a very short rise time.

Adding dispersion to the line of FIG. 1 provides electrical characteristics which allow the generation and subsequent propagation of oscillatory signals on the line. In practice the input pulse which is injected at 1 into the line excites the formation of a radio frequency signal. Energy is transferred from the injected pulse into the radio frequency signal at the leading edge of the injected pulse. Consequently the leading edge of the injected signal is coincident with the leading oscillation in the radio frequency signal with synchronism of the signals being maintained as the input pulse and radio frequency signal propagate along the line.

At the leading edge of the input pulse energy is lost from the pulse in various ways. For example energy is lost by transfer to the radio frequency signal, by reflection from the shock front and by dissipation in the non-linear material which may be ferrite beads threaded onto lengths of metal conductor wire. The proportion of energy which is converted into radio frequency signal is dependent upon the competition between these loss processes. Additionally the proportion of energy which may be converted into a radio frequency signal is dependent upon the relative time duration of one period of the radio frequency oscillation and the time duration of the shock front which can be produced by the input pulse. In order to increase the radio frequency formation efficiency it is necessary to reduce the shock front duration in comparison with the radio frequency oscillation period.

The efficiency of circuits such as shown in FIG. 1 is limited by the duration of the shock front which can be produced by the input pulse. Such conventional circuits can form radio frequency signals with efficiencies of up to 40% at radio frequency oscillation frequencies of 1GHz. At higher oscillation frequencies the radio frequency formation efficiency decreases for the three reasons outlined above. Additional losses of radio frequency energy occur after the radio frequency oscillation has been formed. As the radio frequency oscillation propagates towards the output point 2 of the circuit, it flows through many sections or cells of the transmission line. This leads to several dissipative loss mechanisms, one of which is magnetic loss in the saturated magnetic material. Despite saturation of the magnetic material by the input pulse the high radio frequency currents which are associated with the radio frequency signal can lead to partial remagnetisation of the magnetic material. This partial remagnetisation extracts energy from the radio frequency signal and leads to an attenuation of the radio frequency signal.

OBJECTS OF THE INVENTION

Thus one object of the present invention is to provide a generally improved non-linear dispersive transmission line assembly with greater efficiency in the production of a radio frequency signal from an input pulse.

This and other objects and advantages of the present invention will become more apparent from details disclosed in the following specification where preferred embodiments of the invention are described.

SUMMARY OF THE INVENTION

According to one aspect of the present invention there is provided a non-linear dispersive transmission line assembly for producing high power radio frequency electrical signals, including a transmission line having a plurality of series connected inductors each incorporating saturable magnetic material to provide non-linearity, a first array of capacitors interconnecting outermost ends of immediately adjacent pairs of the inductors, and a second array of capacitors interconnecting outermost ends of immediately adjacent pairs of inductors, with the second array interconnection points being spaced by one inductor from the first array interconnection points, and means for applying a first magnetic field to the transmission line in a direction substantially perpendicular to the direction of a second magnetic field produced in the transmission line by the application thereto of a high voltage input pulse to promote the formation of a very short duration shock front at the leading edge of the input pulse when propagating through the transmission line and reduce energy competition and dissipation in the transmission line and thereby increase transfer of energy from the input pulse to the output high power radio frequency electrical signal and reduce attenuation of the output high power radio frequency electrical signal.

Preferably the first array capacitors comprise a sub-array of coupling capacitors connected in parallel with one another with each connected to an outermost end of immediately adjacent pairs of the inductors and a sub-array of linking capacitors connected in series with one another across the first array connections to the inductor outermost ends with each linking capacitors linking the two coupling capacitors connected across the outermost ends of the pairs of the inductors.

Conveniently the second array capacitors comprise a sub-array of coupling capacitors connected in parallel with one another with each connected to an outermost end of immediately adjacent pairs of the inductors, and a sub-array of linking capacitors connected in series with one another across the second array connections to the inductor outermost ends with each second array linking capacitor linking the two second array coupling capacitors connected across the innermost ends of a pair of inductors.

Advantageously the inductors are each in the form of ferrite beads threaded on to lengths of electrically conductive wire or are in the form of an electrically conductive helical winding wound around a magnetic toroid.

Preferably the inductors are series interconnected in a linear sequence and the first and second array capacitors are located substantially transversely to the linear axis through the inductors.

Conveniently the first magnetic field application means is a solenoidal electrical conductor winding extending around the linear axis operable to carry a pulsed or direct current to produce an axial magnetic field through the magnetic material of the inductors.

Advantageously the first magnetic field application means is a plurality of permanent magnets arranged unlike pole to unlike pole in a line substantially parallel to and spaced form the linear axis and operative to produce a predominantly axial magnetic field through the magnetic field of the inductors.

Alternatively the inductors are series interconnected and located substantially in parallel to one another substantially transversely to the linear axis through the assembly.

Preferably the first magnetic field application means is an array of permanent magnets arranged substantially parallel to and externally spaced from the assembly linear axis with like poles directed towards the linear axis.

Conveniently the first magnetic field application means is an array of permanent magnets arranged such that each inductor includes two magnets of the array located one at each end of the inductor and operative to produce a substantially axial magnetic field through the inductor magnetic material.

Advantageously the assembly includes a container in which the capacitor arrays and inductors are located.

DESCRIPTION OF THE DRAWINGS

For a better understanding of the present invention, and to show how the same may be carried into effect, reference will now be made, by way of example, to the accompanying drawings in which.

DESCRIPTION OF EMBODIMENTS OF THE INVENTION

Figure 8:
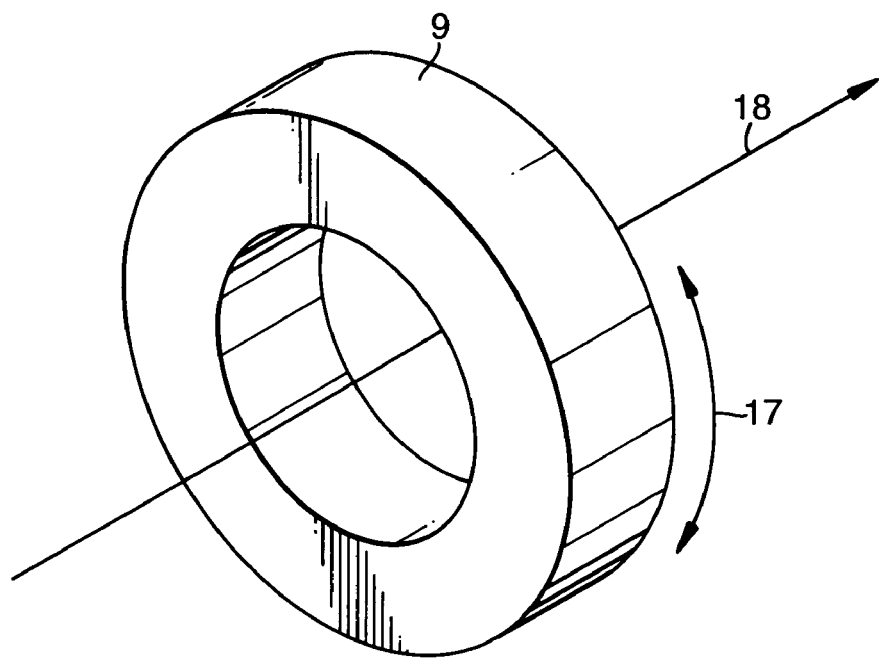
FIG. 8 is a schematic diagram illustrating the geometry of non-linear magnetic toroids as utilised in the transmission line assembly according to the present invention.

A non-linear dispersive transmission line assembly according to the present invention is utilised for producing high power radio frequency electrical signals. To this end the assembly includes a transmission line such as shown generally at 6 in FIG. 2 and at 7 in FIG. 5 of the accompanying drawings. Each transmission line includes a plurality of series connected inductors 8 each incorporating saturable magnetic material to provide non-linearity. The inductors 8 may be of any convenient formation. Preferably each inductor comprises ferrite beads 9 threaded on lengths of electrically conductive wire, preferably metal wire, as shown in FIG. 8 of the accompanying drawings or may be a conductive helical winding wound around a magnetic toroid.

Each transmission line 6, 7 includes a first array 11 of capacitors interconnecting outermost ends of immediately adjacent pairs of the inductors 8. Thus the first array 11 comprises a sub-array of coupling capacitors 12 connected in parallel with one another with each connected to the outermost end of immediately adjacent pairs of the inductors 8 and a sub-array of linking capacitors 13 connected in series with one another across the first array connections to the inductor outermost ends with each linking capacitor 13 linking the two coupling capacitors 12 connected across the outermost ends of a pair of the inductors 8.

Each transmission line used in the transmission assembly of the present invention also includes a second array 14 of capacitors interconnecting outermost ends of immediately adjacent pairs of the inductors 8, with the second array interconnection points being spaced by one inductor 8 from the first array interconnection points. Thus the second array 14 of capacitors comprises a sub-array of coupling capacitors 15 connected in parallel with one another with each connected to an outermost end of immediately adjacent pairs of the inductors 8 and a sub-array of linking capacitors 16 connected in series with one another across the second array connections to the inductor outermost ends with each second array linking capacitor 16s linking the two second array coupling capacitors 15 connected across the outermost ends of a pair of inductors 8.

Figure 1:
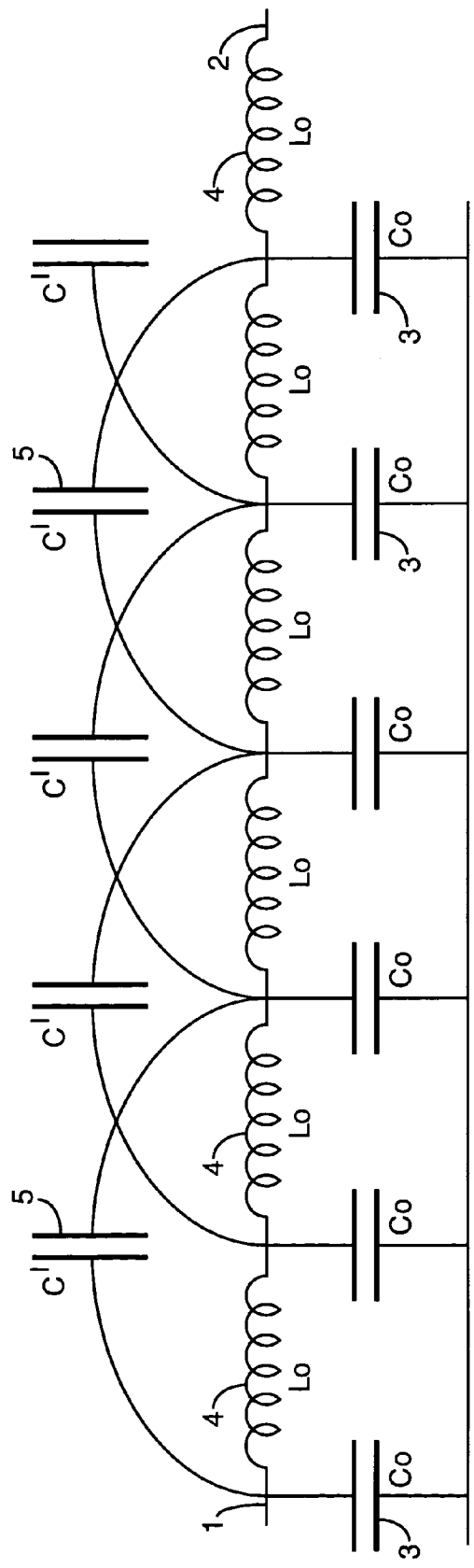
FIG. 1 is a schematic diagram of part of a conventional non-linear dispersive transmission line not according to the present invention.
Figure 2:
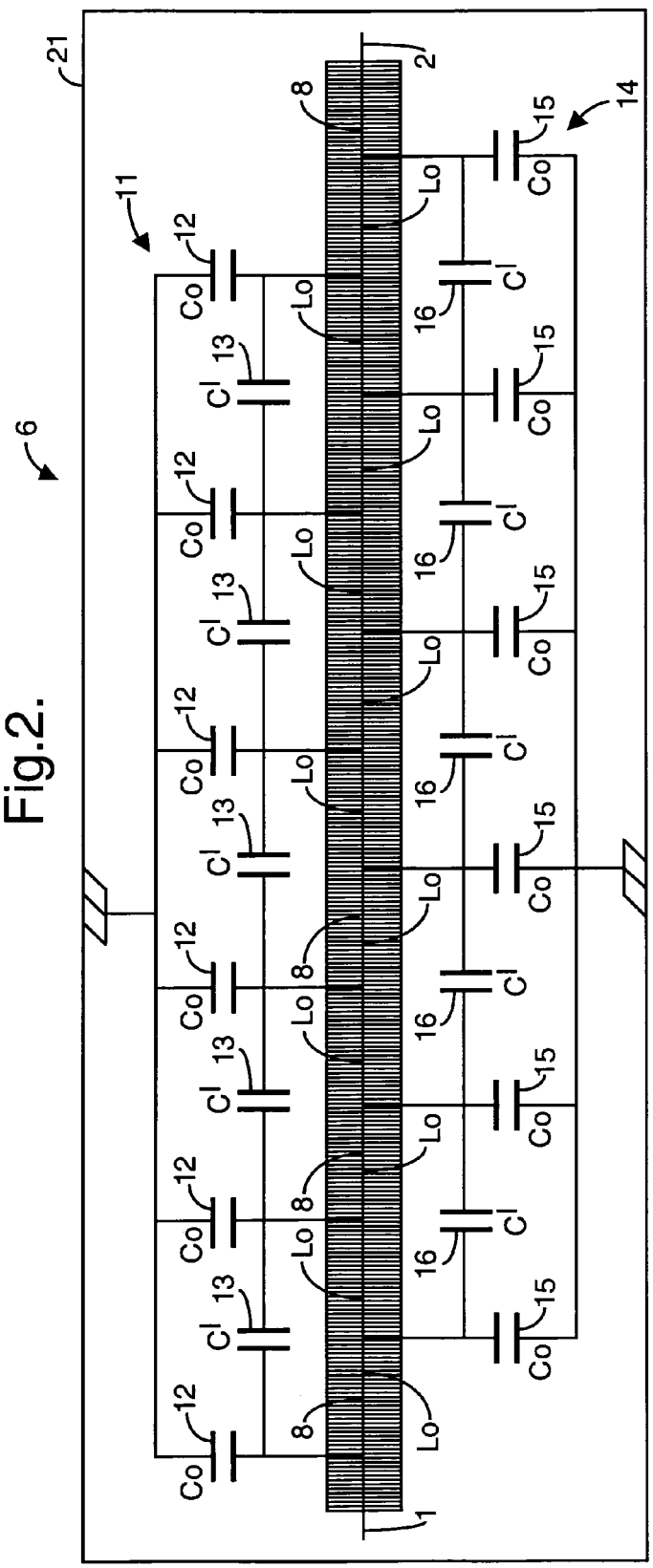
FIG. 2 is a schematic diagram of a transmission line for use in a non-linear dispersive transmission line assembly according to the present invention.
Figure 3:
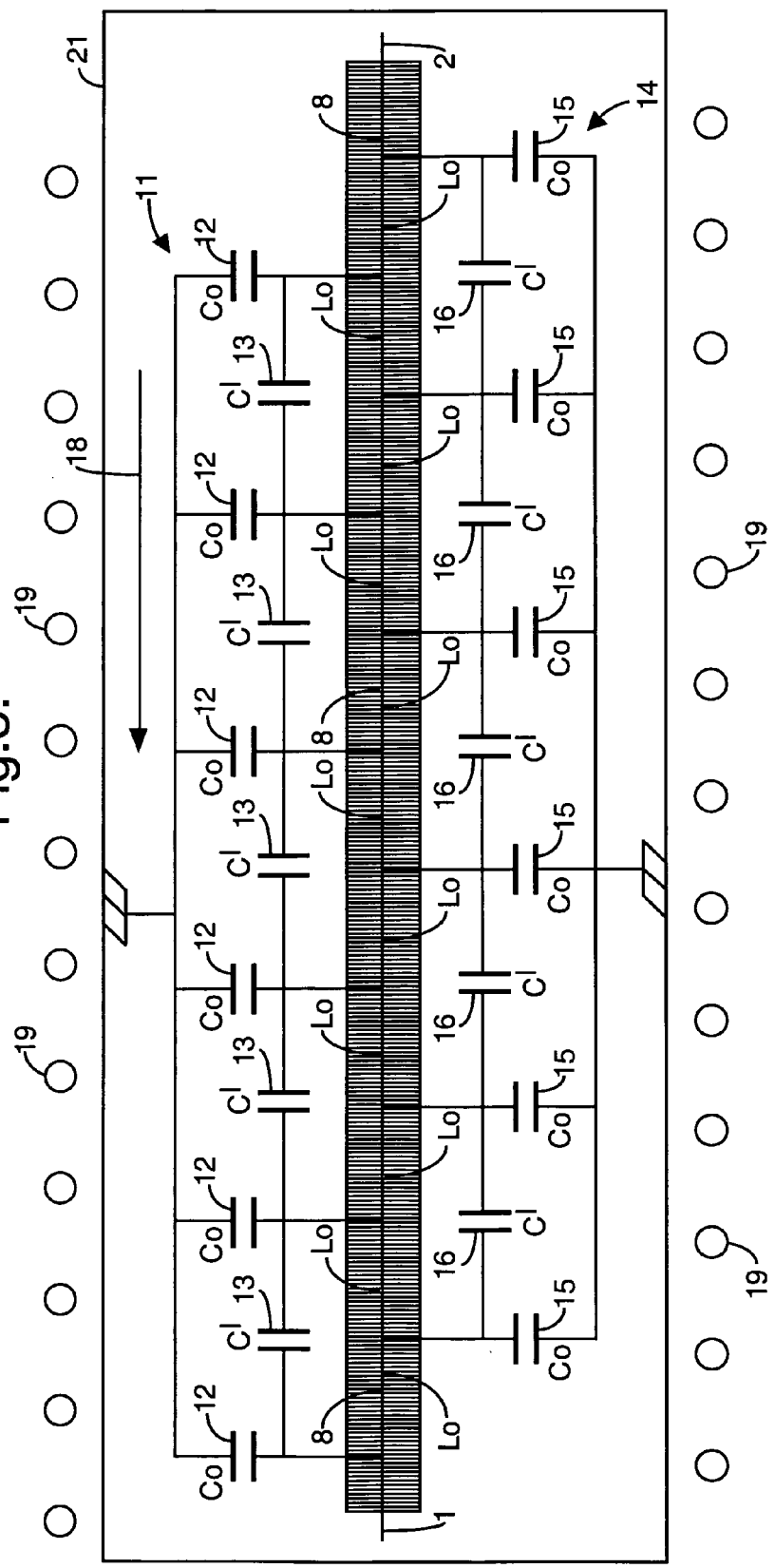
FIG. 3 is a schematic diagram of a transmission line assembly according to a first embodiment of the present invention incorporating the transmission line of FIG. 2.
Figure 4:
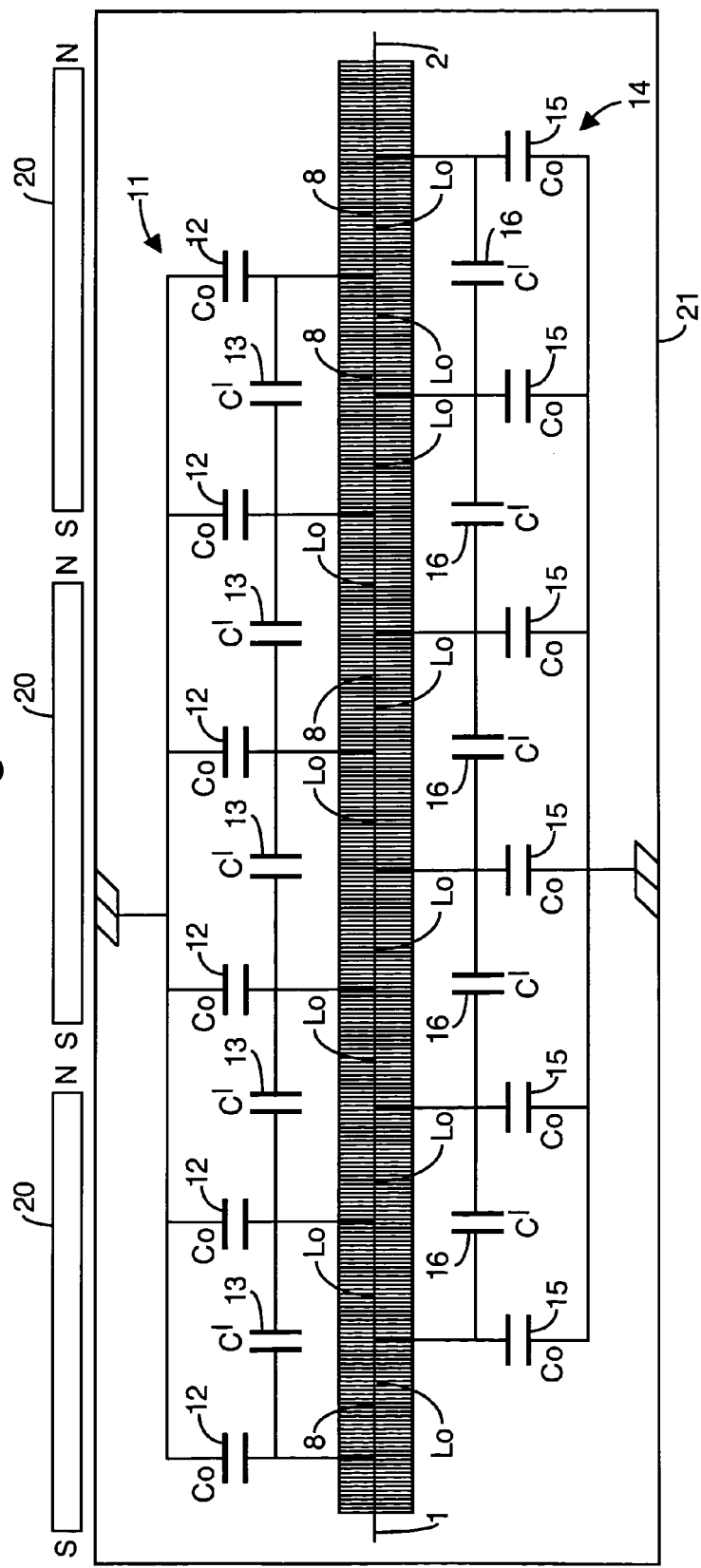
FIG. 4 is a schematic diagram of a transmission line assembly according to a second embodiment of the present invention incorporating the transmission line of FIG. 2.

In the FIG. 2, 3 and 4 embodiments of the present invention the inductors 8 are series interconnected in a linear sequence and the first and second array capacitors 11 and 14 are located substantially transversely to the linear axis through the inductors 8.

Conventionally a small pulsed or direct current is used to condition the non-linear magnetic material in each inductor prior to injection of the main input pulse at 1. This conditioning current is a convenient way for determining the initial state of the non-linear magnetic material. The conditioning current is injected into the circuit at 1 through circuit protection elements (not shown) at the input and output 1 and 2 of the transmission line 11 and flows through each inductor 8 in the transmission line circuit. The conditioning current produces a circumferential magnetic field which orients the magnetic domains of the magnetic material in a suitable direction. The applied conditioning current produces only a circumferential magnetic field so that the internal magnetisation of the magnetic material has only a circumferential component. This component 17 as shown in FIG. 8 can lie anywhere between fully anti-clockwise and fully clockwise but does not possess any axial magnetisation component.

The transmission line assembly according to the present invention also includes means for applying a first magnetic field to the transmission line 6 in a direction 18 substantially perpendicular to the direction of the magnetic field 17 produced in the transmission line 6 by the application thereto of a high voltage input pulse at 1 to promote the formation of a very short duration shock front at the leading edge of the input pulse when propagating through the transmission line and reduce energy competition and dissipation in the transmission line and thereby increase transfer of energy from the input pulse to the output high power radio frequency electric signal at 2 and reduce attenuation of the output high power radio frequency electrical signal at 2. This additional magnetic field application means can take a number of different forms.

Thus in the first embodiment as shown in FIG. 3 the additional field can be produced by the first magnetic field application means in the form of a current carrying solenoidal electrical conductor winding 19 extending around the linear axis and operable to carry a pulsed or direct current to produce an axial magnetic field through the magnetic material of the inductors 8. The winding 19 carries a direct or pulsed current which produces an axial magnetic field 18 through the ferrite beads 9 as shown in FIG. 8.

Alternatively is shown in FIG. 4 the first magnetic field application means can be a plurality of permanent magnets 20 arranged unlike pole to unlike pole in a linear substantially parallel to and spaced from the linear axis and operative to produce a predominantly axial magnetic field through the magnetic material of the inductors. In the specification the linear axis is the axis running through the inductors 8 in the direction of the input 1 to the output 2. Conveniently these magnets 20 can be arranged along the outside of a container 21 in which the capacitor arrays 11 and 14 and inductors 8 are located. Similarly in the embodiment of FIG. 3 the solenoidal current windings 19 can be located outside and surrounding the container 21. The FIG. 4 embodiment produces a magnetic field in the magnetic components which is predominantly axial with respect to the ferrite beads 9 forming the inductors 8 although there are also non-axial magnetic field components produced. The embodiment of FIG. 4 can produce a radio frequency pulse which is amplitude modulated because the axial and non-axial magnetic field components are not uniformly distributed along the transmission line.

Figure 5:
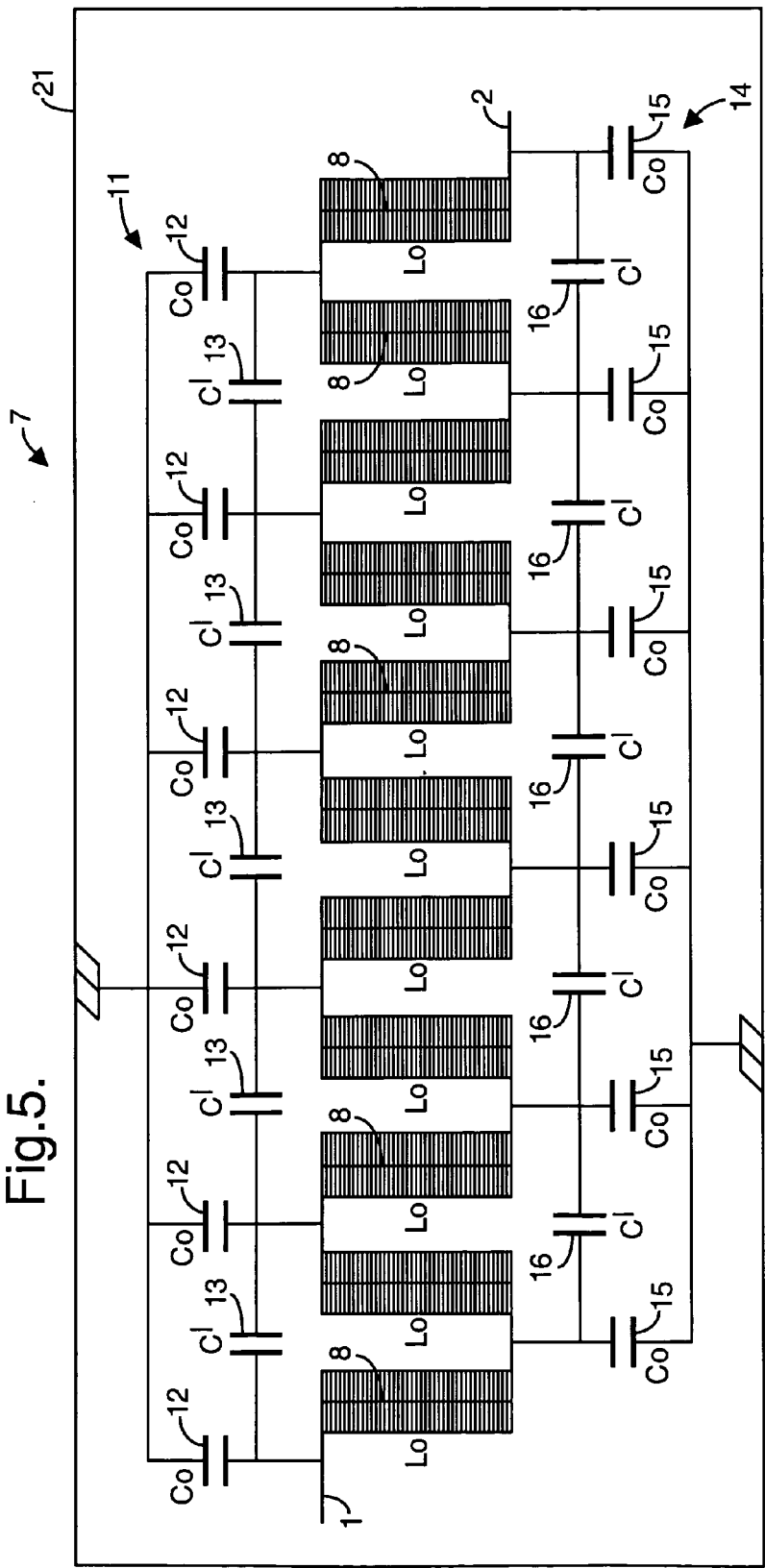
FIG. 5 is a schematic diagram of the further variant of a transmission line for use in the transmission line assembly of the present invention.
Figure 6:
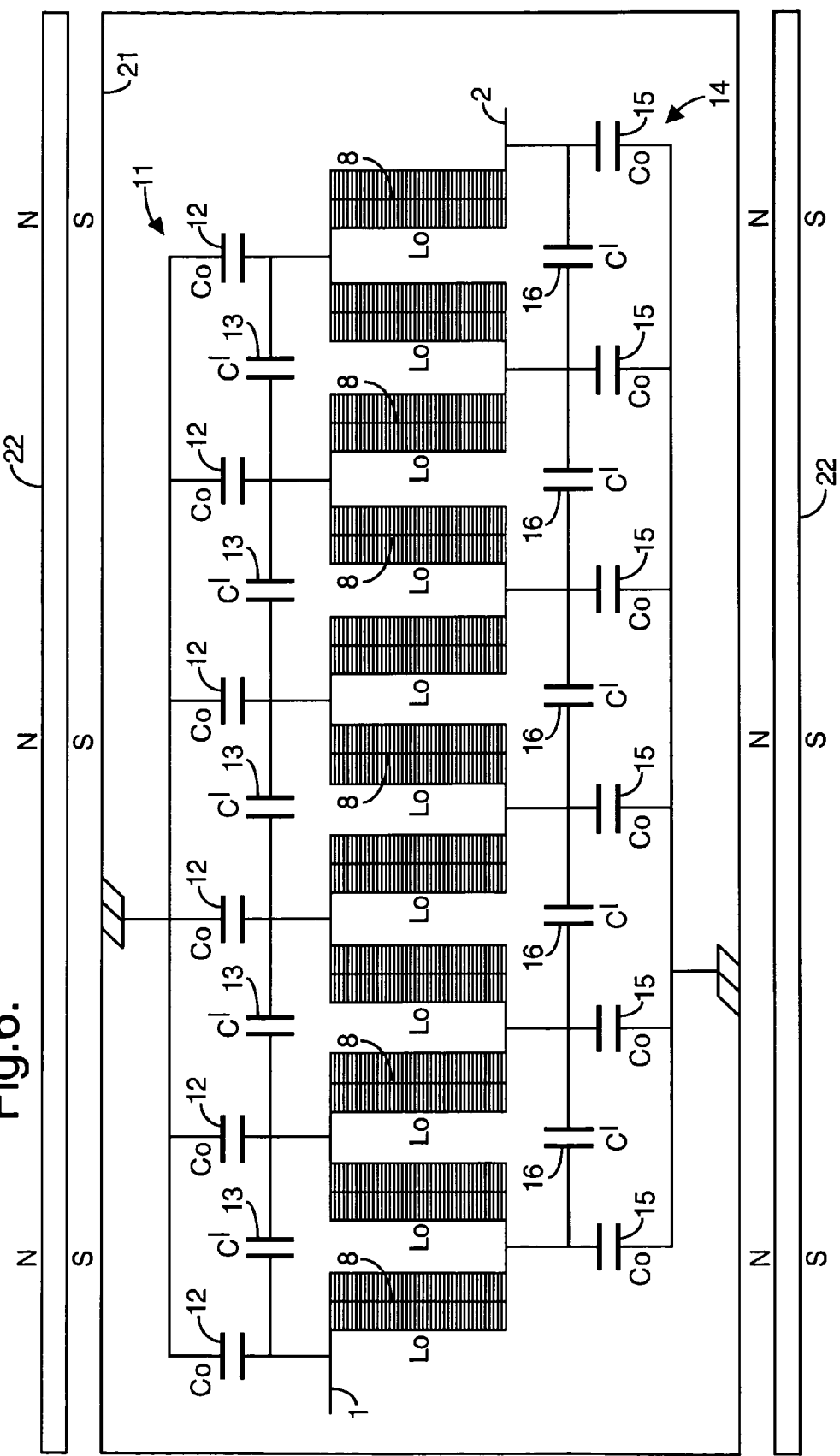
FIG. 6 is a schematic diagram of a transmission line assembly according to a third embodiment of the present invention incorporating a transmission line of FIG. 5.
Figure 7:
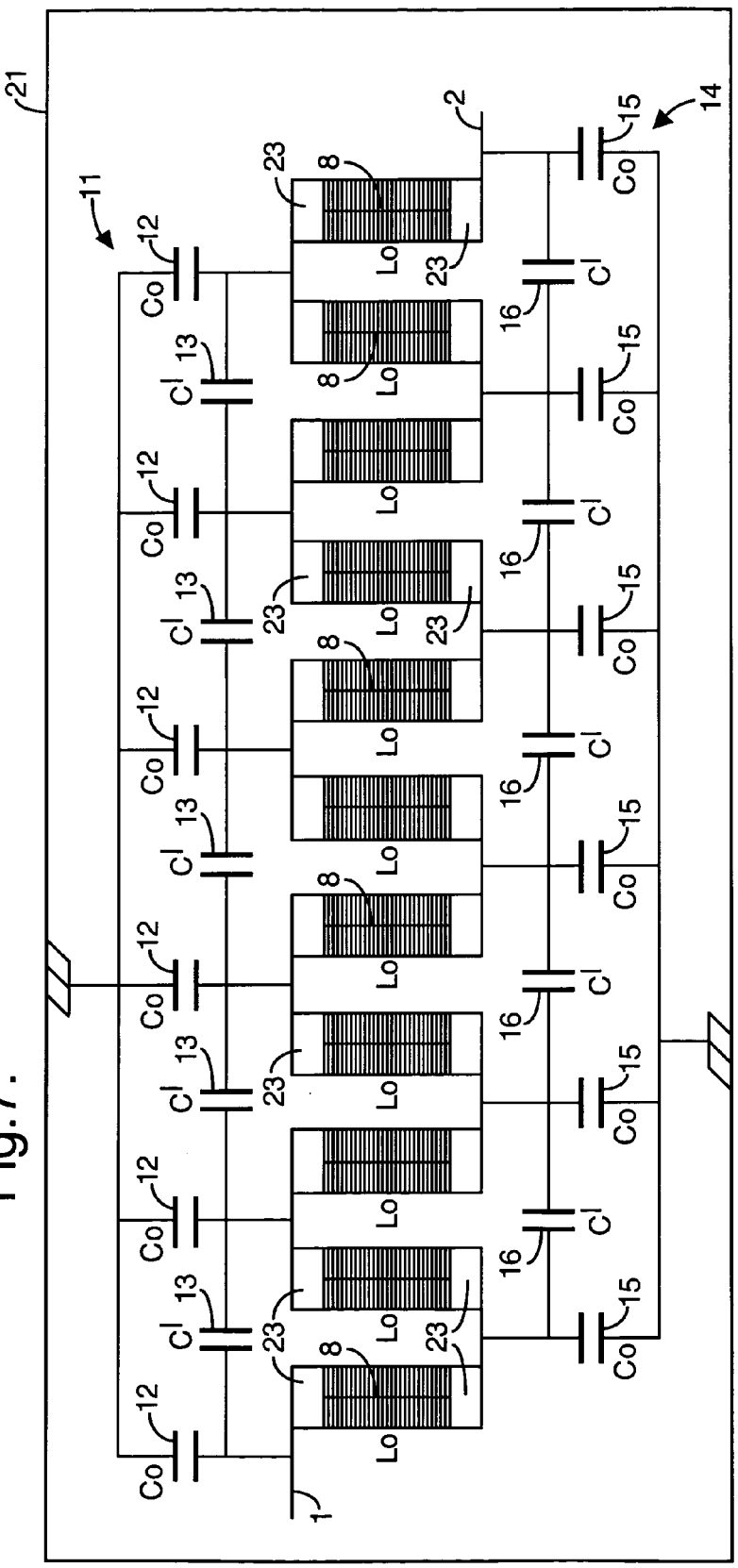
FIG. 7 is a schematic diagram of a transmission line assembly according to a fourth embodiment of the present invention incorporating a transmission line according to FIG. 5.

In the embodiments of FIGS. 5, and 6 and 7 of the present invention the inductors 8 are series interconnected and located substantially in parallel to one another substantially transversely to the linear axis along the line 1 - 2 through the assembly. In this case current flows in diametrically opposed directions in adjacent inductors 8 as it flows through the transmission line.

In the FIG. 6 embodiment of the invention the first magnetic field application means is an array of permanent magnets 22 arranged substantially parallel 2 and externally spaced from the assembly linear axis with like poles directed towards the linear axis through the inductors 8. The magnets 22 may be located either inside or outside the container 21 although in FIG. 6 the magnets are located outside the container 21. The axial field which is applied to the inductors 8 in FIG. 6 is alternatively parallel to and anti-parallel to the current which flows through the inductors. This is because the direction of current flow reverses direction at each section of the transmission line 7. Thus in FIG. 6 the current flows north to south through one inductor then south to north through the next, north to south through the next etc., whereas the applied magnetic field is oriented in the same direction over the full extent of the transmission line 7. The alternating orientations of circuit current and axial magnetic field does not detrimentally affect the behaviour of the circuit.

The embodiment of the invention as shown in FIG. 7 of the accompanying drawings has first magnetic field application means in the form of an array of small permanent magnets 23 arranged such that each inductor includes two magnets 23 of the array located one at each end of the inductor and operative to produce a substantially axial magnetic field through the inductor magnetic material. The magnets 23 are of a similar size to the non-linear magnetic toroids 10 of the inductors 8 and this arrangement reduces the volume of permanent magnetic material which is required to produce a suitable axial magnetic field, and thereby reducing the cost, and allows the direction of axial magnetic field to be chosen through each inductor.

The effect of including an axial magnetic field according to the present invention is to modify the dynamics of rapid magnetisation changes in the non-linear magnetic material when the input pulse is injected at 1 into the transmission line 6 and 7. The axial magnetic field allows rapid magnetisation of the non-linear material in the inductors 8 and allows the formation of a very short shock front at the leading edge of the input pulse. By creating the conditions which allow the formation of a very short duration shock front, the energy competition processes in the transmission line are modified which determine the division of energy between losses and radio frequency signal formation. By creating these conditions a larger proportion of the input energy can be transferred into the radio frequency signal and the formation efficiency of the radio frequency signal thereby improved.

It is to be understood that the application of a circumferential magnetic field only as is the case conventionally with conventional radio frequency generating circuits, leads to magnetisation changes which are referred to as incoherent which are substantially slower than the coherent magnetisation changes produced by the assembly of the present invention.

A second beneficial feature of introducing an axial magnetic field to the circuit of the present invention is to reduce energy dissipation in the radio frequency signal as this signal propagates along the transmission line. After formation of radio frequency oscillations these oscillations propagate along the transmission line and pass through many inductace/ capacitance sections of the line. Various energy loss processes lead to attenuation of the radio frequency signal in the transmission line one of which is magnetic losses in the non-linear magnetic material.

Magnetic losses occur because the large amplitude radio frequency current which is associated with the radio frequency signal produces a radio frequency magnetic field which is applied to the non-linear magnetic material. This radio frequency magnetic field tends to modulate the magnetisation of the magnetic material at very high frequency. High frequency magnetic losses can be severe if the magnetisation of the non-linear magnetic material is significantly modulated.

The presence of a strong axial magnetic field tends to hold the magnetisation of the non-linear material in a fixed orientation after passage of the shock front. Under these circumstances the modulating effect of the radio frequency current on the magnetisation of the non-linear material is reduced and the magnetic energy losses are reduced. Consequently attenuation of the radio frequency signal is reduced by the presence of a strong axial magnetising field in the non-linear magnetic material. Hence the additional magnetic field improves transfer of energy from the input pulse to the radio frequency signal and thus reduces the ratio frequency signal attenuation which is caused by magnetic losses. Both these effects improve the performance of the transmission assembly of the invention.

Various modifications and alterations may be made to the embodiments of the present invention described and illustrated, within the scope of the present invention as defined in the following claims.

What is claimed is:

1. A non-linear dispersive transmission line assembly for producing high power radio frequency electrical signals, including a transmission line having a plurality of series connected inductors each incorporating saturable magnetic material to provide non-linearity, a first array of capacitors interconnecting outermost ends of immediately adjacent pairs of the inductors, and a second array of capacitors interconnecting outermost ends of immediately adjacent pairs of inductors, with the second array interconnection points being spaced by one inductor from the first array interconnection points, and means for applying a first magnetic field to the transmission line in a direction substantially perpendicular to the direction of a second magnetic field produced in the transmission line by the application thereto of a high voltage input pulse to promote the formation of a very short duration shock front at the leading edge of the input pulse when propagating through the transmission line and reduce energy competition and dissipation in the transmission line and thereby increase transfer of energy from the input pulse to the output high power radio frequency electrical signal and reduce attenuation of the output high power radio frequency electrical signal.

2. An assembly according to claim 1, wherein the first array capacitors comprise a sub-array of coupling capacitors connected in parallel with one another with each connected to an outermost end of immediately adjacent pairs of the inductors and a sub-array of linking capacitors connected in series with one another across the first array connections to the inductor outermost ends with each linking capacitor linking the two coupling capacitors connected across the outermost ends of the pairs of the inductors.

3. An assembly according to claim 2, wherein the second array capacitors comprise a sub-array of coupling capacitors connected in parallel with one another with each connected to an outermost end of the immediately adjacent pairs of the inductors, and a sub-array of linking capacitors connected in series with one another across the second array connections to the inductor outermost ends with each second array linking capacitor linking the two second array coupling capacitors connected across the outermost ends of a pair of inductors.

4. An assembly according to claim 3, wherein the inductors are each in the form of ferrite beads threaded on to lengths of electrically conductive wire or are in the form of an electrically conductive helical winding wound around a magnetic toroid.

5. An assembly according to claim 3, wherein the inductors are series interconnected in a linear sequence and wherein the first and second array capacitors are located substantially transversely to the linear axis through the inductors.

6. An assembly according to claim 5, wherein the first magnetic field application means is a solenoidal electrical conductor winding extending around the linear axis operable to carry a pulsed or direct current to produce an axial magnetic field through the magnetic material of the inductors.

7. An assembly according to claim 5, wherein the first magnetic field application means is a plurality of permanent magnets arranged unlike pole to unlike pole in a line substantially parallel to and spaced from the linear axis and operative to produce a predominantly axial magnetic field through the magnetic field of the inductors.

8. An assembly according to claim 3, wherein the inductors are series interconnected and located substantially in parallel to one another substantially transversely to the linear axis through the assembly.

9. An assembly according to claim 8, wherein the first magnetic field application means is an array of permanent magnets arranged substantially parallel to and externally spaced from the assembly linear axis with like poles directed towards the linear axis.

10. An assembly according to claim 8, wherein the first magnetic field application means is an array of permanent magnets arranged such that each inductor includes two magnets of the array located one at each end of the inductor and operative to produce a substantially axial magnetic field through the inductor magnetic material.

11. An assembly according to claim 1, including a container in which the capacitor arrays and inductors are located.

\* \* \* \* \*